US010790779B2

(12) United States Patent
Balog, Jr. et al.

(10) Patent No.: US 10,790,779 B2
(45) Date of Patent: Sep. 29, 2020

(54) SYSTEMS AND METHODS FOR DETERMINING ARC EVENTS USING WAVELET DECOMPOSITION AND SUPPORT VECTOR MACHINES

(71) Applicant: The Texas A&M University System, College Station, TX (US)

(72) Inventors: Robert S. Balog, Jr., College Station, TX (US); Zhan Wang, Sunnyvale, CA (US)

(73) Assignee: THE TEXAS A&M UNIVERSITY SYSTEM, College Station, TX (US)

(*) Notice: Subject to any disclaimer, the term of this patent is extended or adjusted under 35 U.S.C. 154(b) by 15 days.

(21) Appl. No.: 16/000,694

(22) Filed: Jun. 5, 2018

(65) Prior Publication Data
US 2018/0351505 A1 Dec. 6, 2018

Related U.S. Application Data

(60) Provisional application No. 62/515,071, filed on Jun. 5, 2017.

(51) Int. Cl.
*H02S 40/30* (2014.01)
*H02H 1/00* (2006.01)
(Continued)

(52) U.S. Cl.
CPC .......... *H02S 40/30* (2014.12); *G05B 13/0265* (2013.01); *H01L 31/02021* (2013.01);
(Continued)

(58) Field of Classification Search
CPC ....... H02S 40/30; H02S 50/00; H02H 1/0015; H02H 7/20; H02H 7/205; H02H 1/0092; G05B 13/0265; H01L 31/02021
See application file for complete search history.

(56) References Cited

U.S. PATENT DOCUMENTS

| 9,329,220 B2 | 5/2016 | Balog | |
| 2008/0157781 A1* | 7/2008 | Mason | H02H 1/0092 324/536 |
| 2014/0067291 A1* | 3/2014 | Balog | H02S 50/10 702/58 |

OTHER PUBLICATIONS

M. Sarlak and S.M. Shahrtash "High Impedance Fault Detection in Distribution Networks Using Support Vector Machines Based on Wavelet Transform" 2008 IEEE Electric Power and Energy Conference <URL: https://ieeexplore.ieee.org/stamp/stamp.jsp?tp=&arnumber=4763380> (Year: 2008).*

(Continued)

*Primary Examiner* — Robert E Fennema
*Assistant Examiner* — Jonathan Michael Skrzycki
(74) *Attorney, Agent, or Firm* — Conley Rose, P.C.

(57) ABSTRACT

In some examples, a system comprises a first component; a second component configured to receive signals from the first component via one or more wires; and a controller. In at least some examples, the controller is coupled to the one or more wires and is trained with a classification model to distinguish between signals indicating arc events and signals not indicating arc events. In at least some example, the controller is further configured to: receive the signals; extract features that are at least partially related to the received signals; classify the extracted features using the classification model; determine an occurrence of the arc event based on the classification; and provide an output signal indicating an arc event.

20 Claims, 5 Drawing Sheets

(51) Int. Cl.
    *H02H 7/20*          (2006.01)
    *G05B 13/02*        (2006.01)
    *H02S 50/00*        (2014.01)
    *H01L 31/02*        (2006.01)

(52) U.S. Cl.
    CPC ............ *H02H 1/0015* (2013.01); *H02H 7/20* (2013.01); *H02H 7/205* (2013.01); *H02S 50/00* (2013.01); *H02H 1/0092* (2013.01)

(56) References Cited

OTHER PUBLICATIONS

S. Golhani and S. Bhongade "Detection and Error Analysis of High Impedance Fault Using Wavelet Tranform, Traveling Wave and Support Vector Machine" 2018 IUP Journal of Electrical and Electronics Engineering vol. XI No. 2 pp. 7-23 (Year: 2018).*

Zhehan Yi, Line-to-Line Fault Detection for Photovoltaic Arrays Based on Multiresolution Signal Decomposition and Two-Stage Support Vector Machine, IEEE Transactions on Industrial Electronics, May 2017, Retrieved from the Internet at www.researchgate.net (Year: 2017).*

* cited by examiner

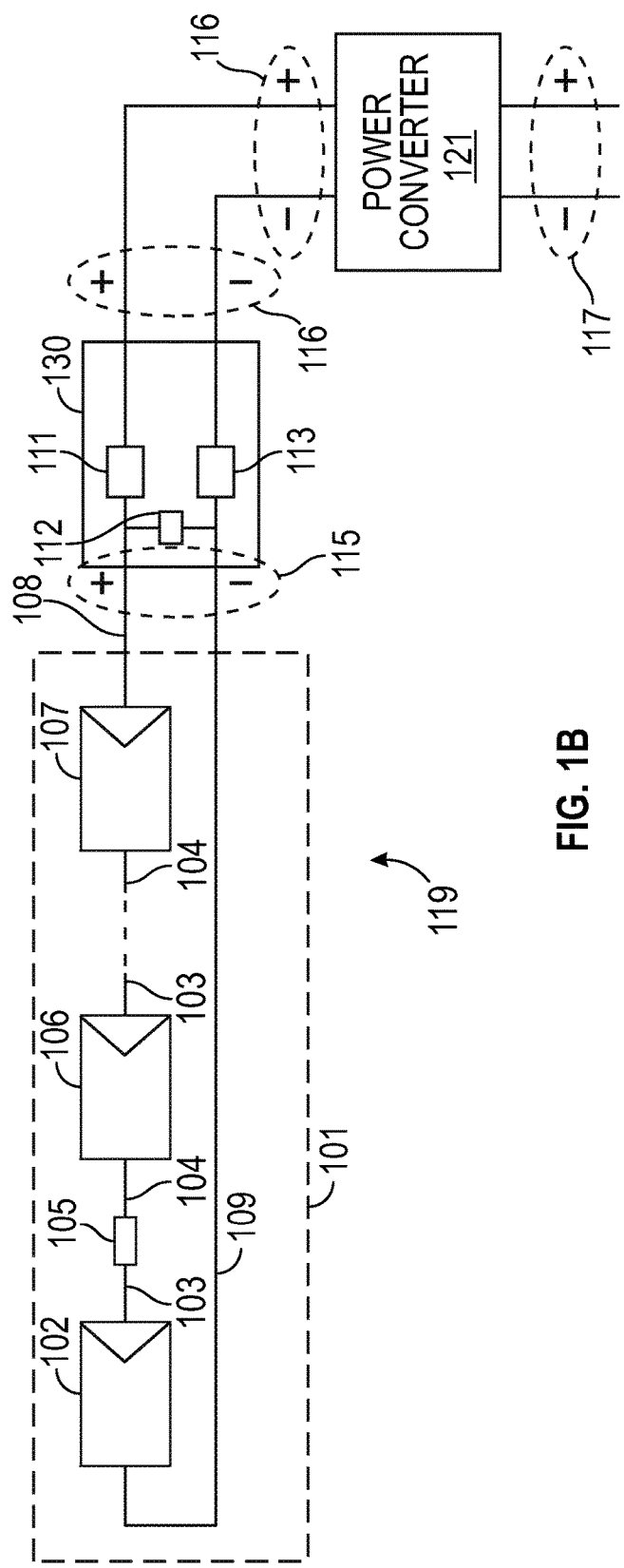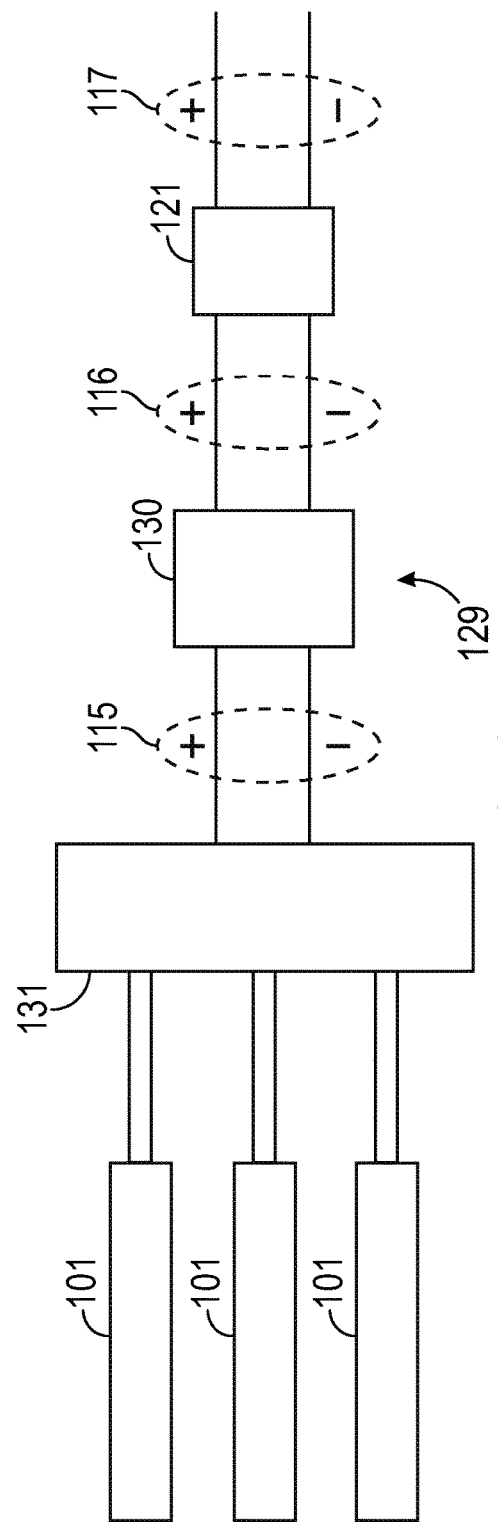
FIG. 1B
FIG. 1C

US 10,790,779 B2

SYSTEMS AND METHODS FOR DETERMINING ARC EVENTS USING WAVELET DECOMPOSITION AND SUPPORT VECTOR MACHINES

CROSS-REFERENCE TO RELATED APPLICATIONS

The present application claims priority to U.S. Provisional Patent Application No. 62/515,071 filed Jun. 5, 2017 and entitled "Method to Determine Arc Faults and Arc Flashes," and is hereby incorporated herein by reference in its entirety for all purposes.

STATEMENT REGARDING FEDERALLY SPONSORED RESEARCH OR DEVELOPMENT

This invention was made with government support under Grant No. ECCS-1238412 awarded by the National Science Foundation. The government has certain rights in the invention.

BACKGROUND

An arc flash occurs when an electric current leaves its intended path and travels through the air from one conductor to another or to ground via air or through a conducting object. During the arc flash, air near the conductors gets ionized and forms a highly-conductive plasma, which forces the air to act as a conductor. The arc flash typically occurs in a power system (e.g., photovoltaic (PV) system, electrical grid, and microgrid) that deals with high-voltages (e.g., voltages over 100V). The following can initiate arc flash: accidental human contact; using equipment that is under-rated for short circuit conditions; contamination of insulated surfaces; overvoltage for the rated insulation, underrated voltage withstand of the insulation material, deterioration of the insulation material, deterioration or corrosion of equipment, intermittent electrical contact due to thermal expansion or mechanical vibration, amongst other reasons.

In some cases, the arc flash lasts for a few microseconds, but serves as an early indicator of an incipient arc fault, which is a continuous arc flash that occurs due to the sustained establishment of the highly-conductive plasma, which conducts as much energy as is available. Stated another way, the arc flash acts as a precursor to the arc fault, and therefore, detecting the arc flash presents an opportunity to remediate the cause of arc fault, and that, in some cases, may prevent a failure of the power system. In a power system, arc flashes/faults can be characterized as series arc flashes/faults and parallel arc flashes/faults.

SUMMARY

In accordance with at least one example of the disclosure, a system comprises a first component; a second component configured to receive signals from the first component via one or more wires; and a controller. In at least some examples, the controller is coupled to the one or more wires and is trained with a classification model to distinguish between signals indicating arc events and signals not indicating arc events. In at least some example, the controller is further configured to: receive the signals; extract features that are at least partially related to the received signals; classify the extracted features using the classification model; determine an occurrence of the arc event based on the classification; and provide an output signal indicating an arc event.

In accordance with at least an example of the disclosure, a method comprises receiving signals by a controller coupled to one or more wires, the one or more wires couple a first component to a second component, the controller trained with a classification model to distinguish between signals indicating arc events and signals not indicating arc events. The method, in some examples, comprises acquiring, by the controller, data relating to the received signals; and extracting, by the controller, a plurality of features relating the received signals. The method, in some examples, comprises classifying, by the controller, the plurality of features using the classification model; and determining, by the controller, an occurrence of an arc event based on the classification.

In accordance with at least an example of the disclosure, a photovoltaic system comprises a controller coupled to one or more wires, wherein the one or more wires couple an power converter and at least one PV module, wherein the controller is trained with a classification model to distinguish between signals indicating arc events and signals not indicating arc events. In some examples, the controller is further configured to: receive the signals; extract features that are at least partially related to the received signals; classify the extracted features using the classification model; determine an occurrence of the arc event based on the classification; and provide an output signal indicating an arc event.

BRIEF DESCRIPTION OF THE DRAWINGS

For a detailed description of various examples, reference will now be made to the accompanying drawings in which:

FIG. 1(b) shows another illustrative photovoltaic (PV) system including an arc detector, in accordance with various examples.

FIG. 1(c) shows yet another illustrative photovoltaic (PV) system including an arc detector, in accordance with various examples.

DETAILED DESCRIPTION

Figure 1A:
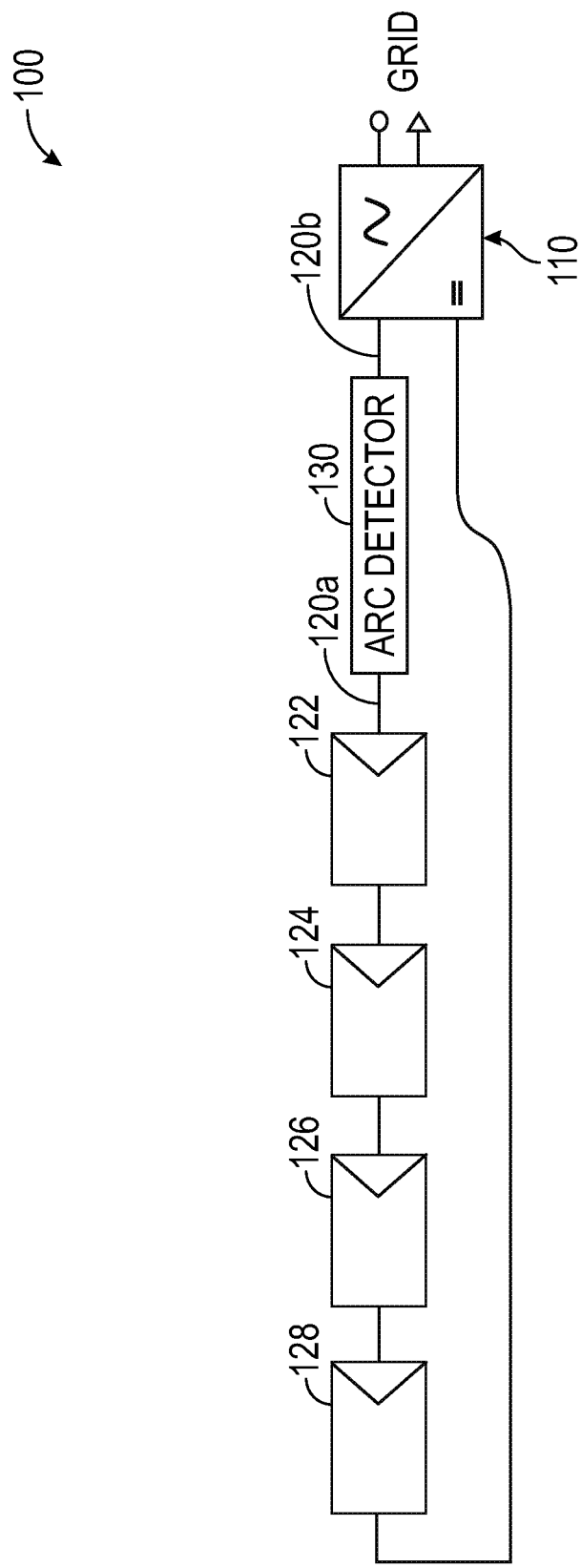
FIG. 1(a) shows an illustrative photovoltaic (PV) system including an arc detector, in accordance with various examples.

The following disclosure relates to detection of arc events, such as arc faults and/or arc flashes in a PV system. However, this disclosure is not limited to PV systems. The instant description relates to a finite energy system that may deal with the issue of arc events, and for the sake of explanation, the example of the PV system is selected. The description below relates to both arc events occurring in alternating current (AC) circuits or direct current (DC) circuits.

A PV system, in some cases, comprises an array of electrical components, including PV module to absorb and convert sunlight into electricity; an inverter configured to convert a DC signal received from the PV module into an AC signal; and conductors configured to route electrical signals (e.g., current, voltage) between the PV modules and the inverter. In some cases, various other components such as a fuse box, battery, combiner box, dc/dc optimizer etc., may be employed.

In the PV system, both series arcs and parallel arcs may occur. In either case the event could be a momentary arc event (herein referred to as an arc flash), or a sustained arc event (herein referred to as an arc fault). A series arc event can occur when a conductor in series with one or more electrical components in the system ceases to maintain proper electrical connectivity. This may be due to tension on the wire from an external force, thermal cycles of expansion and contraction, or motion due to vibration or wind. These conditions may have existed at the time of installation, or may have developed overtime as the system ages, such as the loosening of a bolt or fastener or breakage of a retainer clip. The result is a separation of the conductors carrying current. The resulting voltage, in some cases, increases sufficiently to ionize the air between the separated conductors in order to maintain the flow of current. On the other hand, a parallel arc event (either a fault or a flash) can occur when an electrical insulator ceases to function properly, which creates an alternate path of current.

The unintended current (or, in other words, fault current) that flows due to the arc event may depend on the short-circuit capability of the PV modules, the PV system impedance, and the impedance of the arc event itself. Since the magnitude of this fault current can be close to the operating current of the PV system, an over-current circuit breaker may not detect this fault current and therefore the arc fault is likely to be sustained which can cause extensive damage to the system. It is generally considered that the occurrence of the series arc is relatively harder to detect (relative to the parallel arc).

To detect and extinguish arc events (flashes/faults) the U.S. National Electrical Code has required Arc Fault Circuit Interrupters (AFCI's) (or AFCI interrupter circuits) to be installed in residential PV systems. The AFCI interrupter circuit continuously monitors the current of the PV system and distinguishes between normal and dangerous arcing conditions. Once dangerous arcs are detected, the AFCI interrupter circuit opens its internal contacts, thus de-energizing the PV system and reducing the potential for damage. Some AFCI protection mechanisms use analog filters and current sensors to acquire filtered analog current signals. These protection mechanisms rely on the principle that arc faults have a unique signature, and therefore, typically perform a spectral analysis of the arc fault signals to investigate patterns/signatures unique to arc flashes/faults. In some cases, the spectral analysis is done using transformation algorithms (such as Fourier Transformation algorithm), which decomposes the filtered analog current signals into its frequency components. The spectral analysis of the spectral pattern of the arc event is typically performed in a window of frequency where the arc fault signal is assumed to be detectable. However, research shows that the AFCI circuitry does not always accurately detect all arc faults, in particular, the series arc faults. In some cases, this could be due to the fashion in which the transformation (or detection) algorithm is tuned, and the assumptions made in the filter as to the frequencies in which the arc signature signal appears.

To detect and extinguish arc events (flashes/faults) the U.S. National Electrical Code has required Arc Fault circuit interrupters (AFCI's) (or AFCI interrupter circuits) to be installed in residential PV systems. In some cases, these protection mechanisms rely on the assumption that arc faults have a unique signature. One method to determine the existence of an arc event is to examine the amplitude off the acquired and filtered signal (e.g., current/voltage). This method assumes that the value of the signal will drop due to the impedance of the arc. Another method of to examine the spectral characteristics of the acquired and filtered signal. This method relies on the assumption that arcs have unique spectral signatures that can be identified from background noise and other system noise. Therefore methods that rely on this assumption typically perform a spectral analysis of the arc fault signals to investigate patterns/signatures that are thought to be unique to an arc event. In some cases, the spectral analysis is done using transformation algorithms, such as Fourier Transformation algorithm. The spectral analysis using Fourier decomposition preferably needs a periodic, wide-sense stationary signal and therefore—in the case of the detection of arcing—is not effective because arcing tends to exhibit characteristics of chaotic than periodic nature. Stated another way, Fourier Transformation algorithms may be more suitable for time-frequency domain analysis of harmonic and periodic disturbances, but they may not be suitable for analyzing abrupt/short-transient signals, such as arc events. Also, Fourier transform gives frequency information and not temporal information. A short-time Fourier transformation (STFT) sets the input signal in a window and provides temporal information. However, it does not provide multiple resolutions in time and frequency because the window is fixed. As the frequency of the signal increases, more cycles (and additional information) are contained within the window and thus individual frequency components are not treated equivalently.

Additionally, some of the currently used protection mechanisms are inept in distinguishing between the spectral patterns of arc event and normally present background noise such as from an inverter, dc/dc optimizer, or other electronic circuitry. This drawback may results in false arc detection. This may reduce the effectiveness of the protection mechanism and reduce user confidence in the safety technology. In PV systems, at least some signals of interest include a combination of impulse-like events such as spikes and transients for which STFT and other conventional frequency-based methods are much less suited for analysis. Therefore, an arc detection system that mitigates the above-mentioned issues is desired.

Accordingly, at least some of the examples disclosed herein are directed to systems and methods for detecting arc faults in PV systems. The systems and methods presented in this disclosure are related to an arc detection system that is configured to detect arc events by analyzing a signal of the PV system. In some examples, the signal analyzed is a current flowing in the PV system, and in other examples, the signal analyzed is a voltage of the PV system. In at least some examples, the signal is analyzed in real-time by the arc detection system by first processing the signal using a transformation process and extracting certain features from the signal. The signal is then characterized by a learned algorithm (or a classification model) (e.g., support vector machine (SVM)), which facilitates classifying the extracted features and identifying arc flashes/faults. The classification model, in at least some examples, is developed off-line (e.g., in a lab or a factory) and is then implemented on-line for real-time detection.

Referring now to FIG. 1(a), an illustrative PV system 100 that employs an arc detector 130 configured to detect arc event is shown. The PV system 100 includes PV modules 122, 124, 126, 128, and a power converter 110. In some examples, the power converter 110 is configured to perform as an inverter to provide one or more AC signals relative to the signal received (e.g., DC signal) from the PV modules 122, 124, 126, 128 to a grid. In other examples, the power converter 100 is configured as a dc/dc converter to provide one or more DC signals relative to the signals received. The arc detector 130 couples to the PV module 122 via a conductor 120a and to the power converter 110 via a conductor 120b. In one example, the arc detector 130 is configured to receive the signal in the conductors 120a, 120b, and perform its arc detection function. Because the sensed signals are affected by arc events, regardless of where they occur in the system, the arc detector 130 therefore may not be directly connected to the locations of the arc events.

FIG. 1(a) depicts the arc detector 130 to be coupled to the array of PV modules 122, 124, 126, 128. In other examples, the arc detector 130 may be employed in the power converter 110. In yet another example, the arc detector 130 may be disposed in other PV system components such as a combiner box (not expressly depicted in FIG. 1(a)), or any other electrical system component that can be adapted to provide real-time monitoring of the PV system 100. As noted above, the received data (e.g., signal) is characterized by the classification model, which is developed off-line (e.g., in a lab or a factory) and is then implemented on-line for real-time detection. The arc detector 130 is configured to detect the occurrence of arc event that occurs in the PV system 100 by analyzing the signal (e.g., current, voltage) received by a signal receiving unit (not expressly depicted in FIG. 1(a)). The received signal (or data) is processed in real-time in the PV system, and the amount of memory and computational power available in the arc detector 130 is limited. Therefore, the received data—which includes a large amount of variables needed to be computed—needs to be transformed in a relatively smaller data set that makes real-time classification relatively easy. The arc detector 130, therefore, in some examples, is configured to transform the received data to a smaller data set, which can be provided to the classification model installed in the arc detector 130 to classify the smaller data set.

Referring now to FIG. 1(b), an illustrative PV system 119 that employs the arc detector 130 configured to detect arc event is shown. The PV system 119 is a DC PV system including series-connected PV modules. The PV system 119 includes a PV string 101 that couples to the arc detector 130, which further couples to a power converter 121. The PV string 101 includes at least one PV module 102 with positive electrical pole (hereinafter "positive pole") that is coupled to a conductor 103 and negative electrical pole (hereinafter "negative pole") that is coupled to a conductor 104. In this example, at least some of the positive poles of the PV modules couple to the conductor 103, and the negative poles couple to the conductor 104. In some examples, more than one PV modules may be connected in series by coupling the positive pole via conductor 103 of the first PV module 102 to the negative pole via the conductor 104 of the second module 106 via, for example, an MC style connector 105, or equivalent. This interconnection may be repeated to achieve the desired number of series connected PV modules in the PV string 101. Not shown in FIG. 1(b) is a ground wire that couples, in some examples, to the PV strings, arc flash detector, and the converter. In some examples, the PV string 101 terminates with a final positive pole that couples to a conductor 108, and a final negative pole 109 that couples to a conductor 109. The final positive and negative conductors 108, 109, respectively, provide electrical power from the PV string 101 to the input 115 of the arc detector 130. The power converter 121 may be a dc/dc converter or a dc/ac converter inverter. The power converter 121 accepts input power from the arc detector 130 at input terminals 116 and provides output at output terminals 117. The output present at the output terminals 117 may one of a variety of known formats. For example, depending on the type of converter employed in the converter 121, the output terminals 117 may include a single phase alternating current or three-phase alternating current or single-ended or bipolar voltage.

The arc detector 130 may be configured to monitor series current in the PV system 119. Because the sensed signals are affected by arc events, regardless of where they occur in the system, the arc detector 130 therefore may not be directly connected to the locations of the arc events. As further described below in FIG. 2(a), the arc detector 130, in some examples, includes a signal receiving unit, which further includes a sensor, or is configured to couple to a sensor that receives signal (current or voltage) from the PV system, e.g., PV system 119. FIG. 1(b) depicts illustrative positions of such sensors, e.g., sensors 111, 112, 113. In some examples, the sensors 111, 112, 113 may be transducers. In some examples, one of the sensors, such as sensor 111, may be coupled to the conductor 108 (that is coupled to the positive pole) and provide signal (e.g., current) received from the conductor 108 to a classification model that is trained to classify such input signals. In some examples, one of the other sensors, such as sensor 113, may be coupled to the conductor 109 (that is coupled to the negative pole) and provide a signal (e.g., current) received from the conductor 108 to a classification model that is trained to classify such input signals. In other examples, one of the other sensors, such as sensor 112, may be coupled between the conductor 108 and the conductor 109 and provide a signal (e.g., signal related to the potential difference between the conductors 108, 109) received from the conductor 108 to a classification model that is trained to classify such input signals. In some examples, one or more of these sensors (e.g., sensors 111, 112; or sensors 113, 112) may be employed. For example, in a scenario where the PV system 119 includes sensors 111, 112, the arc detector 130 may include two classifiers, one classifier trained to classify current signals received via the sensor 111, and the other classifier trained to classify voltage signals received via the sensor 112.

In some examples, the location of these sensors can assist in classifying whether the arc detector 130 is detecting a series arc event or a parallel arc event. For instance, the signal from the sensor 111 can result in the detection of a series arcing event, and the signal from the sensor 112 can result in the detection of a parallel arcing event. Examples of the occurrence of the series arc event includes the connector 105 being no longer fully engaged due to the previously mention factors of thermal expansion, stress, fatigue, vibration, etc. On the other hand, parallel arc may occur (due to the illustrative reasons mentioned above) between the PV module 102, the conductor 103, and the ground or a conducting element present in/nearby the PV system 119. The controller unit, further described below, may be configured to perform the above-mentioned series/parallel classification. In some examples, the PV string 101 may include an array of batteries or an array of fuel cells or other device capable to supply or store electrical energy. In some examples, the arc detector 130 may be disposed in the power converter 121. Alternatively, in some examples, the arc detector 130 may be configured to be in a PV module, such as the PV module 102. Yet still, alternatively in some examples the arc detector 130 may be configured to be in another system component such as a dc/dc optimizer or combiner box.

Referring briefly to FIG. 1(c), an alternative example of another illustrative DC PV system 129 that employs the arc detector 130 is shown. The DC PV system 129 includes one or more PV strings 101, each comprised of one or more PV modules, such as the PV module 102 (of FIG. 1(b)). The output of each of the PV string 101 may be configured to combine at a combiner box 131. In one example, the combiner box 131 performs the electrical combination before supplying the combined electrical power to the arc detector 130. In other examples, the arc detector 130 may be located between (not expressly shown) each of the PV string 101 and the combiner box 131. In some examples, at least one PV module and the arc detector 130 may be co-located in a single electrical unit. In other examples, at least one PV module, the arc detector 130, and a converter circuit may be disposed/co-located in a single electrical unit. Similar to the PV system 100 described in FIG. 1(a), the example PV systems 119, 129, and others include the arc detector 130, which includes the classification model configured to classify the received signal. This classification model is developed off-line (e.g., in a lab or a factory) and is then implemented on-line for real-time detection.

Figure 2A:
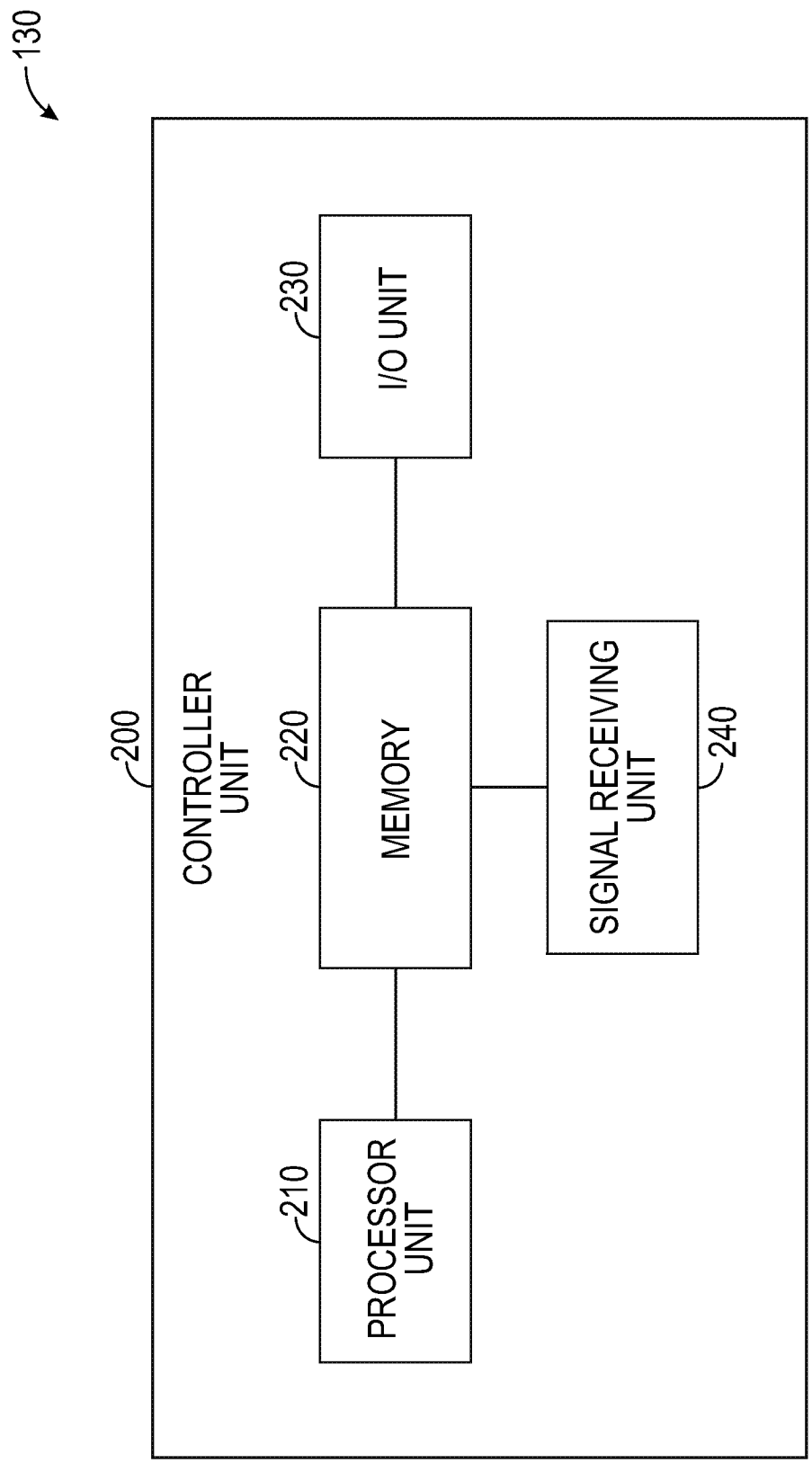
FIG. 2(a) shows an illustrative arc detector, in accordance with various examples.

Referring now to FIG. 2(a), an illustrative arc detector 130 is shown. The arc detector 130, in some examples, includes a controller unit 200, a processor unit 210, memory 220, input/output (I/O) unit 230, and signal receiving unit 240. In FIG. 2(a), the signal receiving unit 240 is depicted to be disposed in the controller unit 200. However, in some examples, the signal receiving unit 240 can be a standalone device coupled between the controller unit 200 and the PV system 100. In some examples, the signal receiving unit 240 includes sensors (such as sensors 111, 112, 113 of FIG. 1(b)), which are configured to receive signal from the PV system, such as PV system 100 or 119 or 129. In some examples, the sensors 111, 112, 113 are a standalone units and one or more of them are configured to couple to the receiving unit 240 via one or more conductors. In some examples, the processor unit 210 may be coupled to the memory 220, the I/O unit 230, and the signal receiving unit 240. In some examples, the processor unit 210 may further include one or more microprocessors or digital signal processors (DSPs). In some examples, in addition to the microprocessors or DSPs, or alternatively, the processor unit 210 may include one or more application specific integrated circuits (ASICs) or field programmable gate arrays (FPGA). In some examples, the memory 220 may include random access memory (RAM), read-only-memory (ROM), removable disk memory, flash memory, or a combination of these types of memories. The memory 220 may, at least in part, be used as cache (or buffer) memory, and typically includes an operating system (OS), which may be one of current or future commercially available operating systems such as, but not limited to, LINUX®, Real-Time Operating System (RTOS), etc.

In some examples, the memory 220 may store one or more software modules. Memory 220 also stores data received from the processor unit 210, and in some examples, from the signal receiving unit 240. Memory 220 may store data related to the signal monitoring and data related to processing performed by the processor unit 210; for example, sampled signal values, computed changes in signal slope over time, and/or one or more thresholds for use in determining arc faults and flashes. In some examples, the memory 220 may also include a classification model, such as SVM, and is configured to work in conjunction with the processor unit 210 and signal receiving unit 240 to identify arc flashes/faults. The signal receiving unit 240, in some examples, is configured to receive signal from the PV system, such as PV systems 100, 119, 129, via sensors. In some examples, the signal (current or voltage) received from the PV system (via sensor) first pre-conditions the amplitude/frequency of the signal. In some examples, the signal is scaled-down (e.g., the amplitude of the received signal is reduced) and filtered using a low-pass, high-pass, band-pass or band-reject filters. The signal until this point is an analog signal. In some examples, the output following sensing and pre-conditioning can then be used by another analog process, such as peak detector, or can be digitized for use by a subsequent digital process. The digitization stage may have its own filtering such as an anti-aliasing filter.

For the arc event detection, the output following sensing and pre-conditioning is filtered using an anti-aliasing filer (not expressly shown), and in some examples, the signal receiving unit 240 includes an analog-to-digital converter (ADC) (not expressly shown). In some examples, the ADC is a separate external component coupled to the controller unit 200 and is not positioned in the signal receiving unit 240. In some examples, the signal receiving unit 240 is coupled to the I/O unit 230 that includes communication channels, such as UART, SPI, I$^2$C, etc.

Figure 2B:
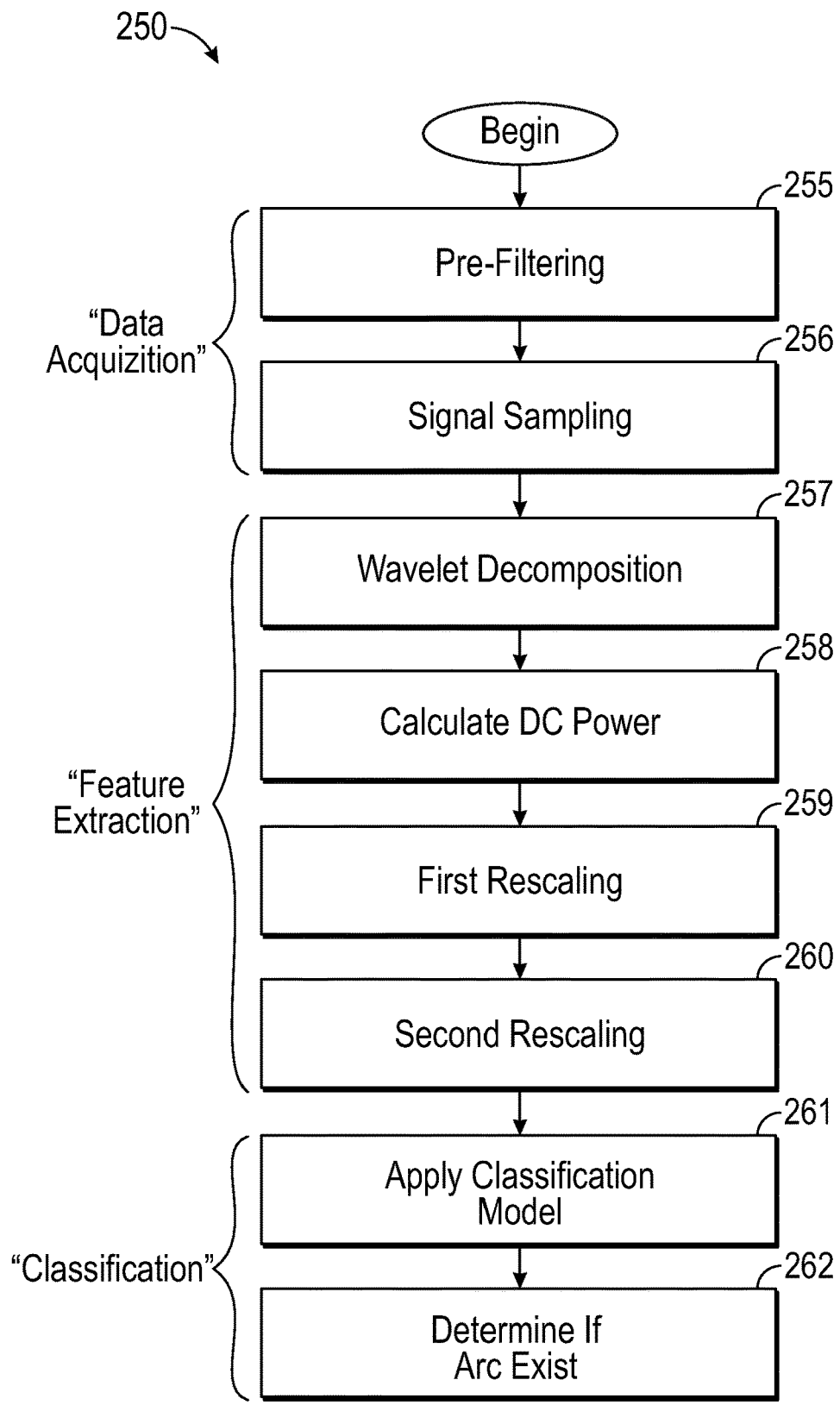
FIG. 2(b) shows an illustrative arc detection method, in accordance with various examples.

Referring now to FIG. 2(b), an illustrative arc detection method 250 (hereinafter method 250) employed by the arc detector 130 to identify arc events (e.g., flashes/faults) that may occur in the PV system 100 is shown. The method 250 is described in tandem with FIG. 2(a). The method 250 begins with a data (or signal) acquisition process that includes steps 255, 256. In some examples, steps 255, 256 are performed by the signal receiving unit 240 (FIG. 2(a)), which is configured to receive a signal (e.g., voltage, current) from the PV system 100. In the instant example, this signal is received via the conductor 120a or 120b. As noted above, the signal receiving unit 240 may include the sensor (e.g., transducer), the anti-aliasing filter and the ADC. In some examples, the sensor senses the signal (e.g., current, voltage) and provides it to the anti-aliasing filter, which is configured to condition the received signal by filtering it (step 255). In some examples, this filtered signal is sampled by the ADC (step 256). This sampled signal, in some examples, is then stored in the memory 220 for further computations.

The method 250 further moves to a feature extraction process that includes steps 257-260. The step 257 includes decomposing (or transforming) the sampled data using a decomposition process, which may be effective in approximating functions with discontinuities, and extracting attributes that facilitate identifying sharp changes like arc event signals. These attributes may include conductor temperature, voltage/current signals, DC voltage/current level, energy, frequency spectrum, etc. For simplicity's sake, in this disclosure, current signals and current levels (e.g., DC current levels) are used as the input attribute.

One example of the above-referenced decomposition process includes wavelet decomposition, which is now briefly explained. This disclosure describes the decomposition done using wavelet transformation process. However, in other examples, various other transformation techniques may be used. Wavelet decomposition is a linear transformation process that allows for time localization of different frequency components of a given signal. The wavelet transformation employs a wavelet prototype function, also referred to as a "mother wavelet," which provides a localized signal processing method to decompose the given signal, or another form (e.g., differential signal) of the given signal, into a series (or levels) of wavelet components.

Each of the wavelet components is a time-domain signal that covers a specific frequency band. Wavelets may be effective in approximating functions with discontinuous or sharp changes like power system fault signals. Hence, with a proper choice of the mother wavelet, a wavelet transformation can be an effective tool for fault/flash detection. Some examples of mother wavelets include: Harr, Daubechies 4, Daubechies 8, Coiflet 3, and Symmlet 8. The wavelet transform has a digitally implementable counterpart, the discrete wavelet transform (DWT), which is defined as:

$$C(j,k) = \sum_{n \in Z} s(n) g_{j,k}(n) \quad j \in N, k \in Z \quad (1)$$

where C(j,k) represents corresponding wavelet coefficient; n is the sample number; s(n) represents the signal to be analyzed and $g_{j,k}(n)$ represents a discrete scaling function (also referred to as father wavelet), which is defined by:

$$g_{j,k}(n) = 2^{-j/2} g(a^{-j}n - kb) \quad (2)$$

where a, b are variable coefficients. In some examples, the values of the coefficients a, b is selected to be 2, 1, respectively. In such a scenario, a dyadic-orthonormal wavelet transform is obtained.

With the aforementioned choice of coefficients, a multi-resolution signal decomposition (MSD) technique exists, which can decompose a signal into different levels with different time and frequency resolutions. In this disclosure, this dyadic-orthonormal wavelet transform with Daubechies 3 (db3) wavelet is utilized to extract arc the features. In other examples, various other types of mother wavelets may be employed. In some examples, the mother wavelets may have the following characteristics: a sufficient number of vanishing moments to represent the salient features of the disturbances; sharp cutoff frequencies to reduce the amount of leakage energy into the adjacent resolution levels; and orthonormal. In examples where the desired information lasts for a very short instant, wavelets with fewer numbers of coefficients are better choices; on the other hand, for the desired information spread over a longer period of time, wavelets with larger numbers of coefficients may be better.

As an example, the first level detail signal may have a frequency range of fs/4-fs/2, where fs is the sampling frequency of the time domain disturbance signal. The second, third, fourth, fifth, and higher-level signals have frequency ranges of fs/4-fs/8, fs/8-fs/16, fs/16-fs/32, fs/32-fs/64, respectively. In some examples, the extracted feature of the method 250 is based upon Parseval's theorem, and states that if the used wavelets form an orthonormal basis and satisfy the admissibility condition, then the energy of the original signal is equal to the energy in each of the expansion coefficients, that is, $$\int |f(t)|^2 = \sum_{k=-\infty}^{\infty} |c(k)|^2 + \sum_{j=0}^{J} \sum_{k=-\infty}^{\infty} |d_j(k)|^2 \quad (3)$$

In summary, after performing wavelet decomposition to the sampled signal received from step 256, the sampled signal is decomposed into J levels by the wavelet transform. The energy is partitioned in time by k and in scale by j in the wavelet domain. c is the approximated coefficients from the wavelet transform, d is for the detail coefficients from the jth level of wavelet transform.

Following wavelet decomposition, the method 250 moves to step 258 that includes calculating the average power of the decomposed signal at each decomposition level. Since the range of values of raw data varies widely, before inserting the decomposed signal into the classification model, the decomposed signal may be rescaled. Rescaling is a subsequent mathematical step performed after the first mathematical step (e.g., decomposition). For example, the wavelet decomposition produces a number of time-domain signals based on the number of decomposition levels. The signals for each decomposition level may then undergo subsequent mathematical processing. The nature of this mathematical processing may be to normalize against some known current, such as the DC operating point, or normalize against an attribute such as temperature, so as to subtract out a known signal, or a system attribute that is known, such as conductor temperature, voltage/current signals, DC voltage/current level, energy, frequency spectrum, etc. Therefore, in some examples, the method 250 moves ahead with step 259 that includes rescaling the decomposed signal. In some examples, the decomposed signal may be rescaled with respect to a PV system operating point, for example, DC current, temperature, etc. In some examples, this rescaling may be performed with respect to a current value (e.g., DC current).

In some examples, the rescaling step 259, by the mathematical functions used in rescaling, may create new signals using the decomposed signals. Therefore, in some examples, an additional rescaling step (step 260) may be included. In some examples, the second rescaling step may include rescaling the previously rescaled data with respect to another one of the above-mentioned attributes of the PV system. The method 250, following the step 260, moves to the classification process that includes steps 261 and 262. Step 261 describes applying the pre-installed classification model to the rescaled signal received from the step 260. As further described below, in some examples, the classification model includes a boundary (or a hyperplane) that separates the rescaled signal with one class denoting the occurrence of arc fault and the other class denoting no arcing. Using this classification model, it can be determined if arcing has occurred (step 262). If the classification model determines that arcing has occurred, the controller unit 200 is configured to generate an output signal indicating the same. In some examples, this output signal is sent to an interrupter circuit that is configured to turn-off (or shut-off) the PV system. In some examples, if the classification model determines that arcing has occurred, the controller unit 200 is configured to provide temporal information (e.g., a time-stamp) on the detected arc event. In some examples, this temporal information is stored in the memory 220. The classification model may use the rescaled signal produced after the rescaling step 259, or in some examples, the classification model may use the signal that has been rescaled at least twice.

Now referring to the classification model that is embedded (or pre-installed) in the arc detection unit 130, which, as described above, facilitates classifying the above-mentioned extracted features and thereby identifying arc flashes and faults. The classification model includes a boundary that enables the controller unit 200 to determine if an arc event has occurred. Such a boundary can be produced by supervised learning algorithms, such as SVM, which deals with creating a hyperplane that creates a separation (e.g., a linear separation) between two data points. In examples where data points are clustered and that linear separation is not possible, the data points can be mapped into feature space (higher dimensional space) where a linear separation is possible. This hyperplane which is linear in the mapped feature space will not be linear in its original input space.

Referring now to the mathematics related to generating this boundary. Let n-dimensional inputs xi (i=1, 2, . . . , M, where M is the number of samples) belong to class-1 or class-2 and associated to labels yi=1 for class-1 and yi=−1 for class-2, respectively. For linearly separable data, a hyperplane f(x)=0 which separates the data can be determined.

$$f(x)=\omega^T x+b=0 \quad (4)$$

where ω is an n-dimensional vector and b is the intercept term. The two vectors determine the position of the separating hyperplane. This separating hyperplane satisfies the constraints f (xi)≥0 if yi=1 and f (xi)≤−1 if yi=−1 and this result in the functional margin:

$$y_i f(x_i)=y_i(\omega^T x_i+b)\geq 1, \text{ for } i=1,2,\ldots,M \quad (5)$$

The separating hyperplane that creates the maximum distance between the plane and the nearest data is called the optimal separating hyperplane. The geometric margin is found to be $1/\|\omega\|^2$. Considering noise with the slack variable ξi and error penalty Ci, the optimal hyperplane can be found by solving the following convex quadratic optimization problem:

$$\min_{\omega,b} \frac{1}{2}\|\omega\|^2 + C\sum_{i=1}^{m}\xi_i \quad (6)$$

$$\text{s.t. } y_i(\omega^T x_i + b) \geq 1 - \xi_i, i = 1, \ldots, m$$

$$\xi_i \geq 0, i = 1, \ldots, m$$

Examples are now permitted to have functional margin in Equation 5, less than 1, and if an example has functional margin 1−ξi (with ξ>0), the extra cost of the objective function would be Cξi. The parameter C controls the relative weighting between the twin goals of making the $\|\omega\|^2$ small and of ensuring that some examples have a functional margin of at least 1. Examples are now permitted to have functional margin in Equation 2, less than 1, and if an example has functional margin 1−ξi (with ξ>0), the extra cost of the objective function would be Cξi. The parameter C controls the relative weighting between the twin goals of making the $\|\omega\|^2$ small and of ensuring that most examples have functional margin of at least 1. The Lagrangian can now be formed (see equation 7 below):

$$L(\omega, b, \xi, \alpha, r) = \quad (7)$$

$$\frac{1}{2}\omega^T \omega + C\sum_{i=1}^{m}\xi_i - \sum_{i=1}^{m}\alpha_i[y_i(x^T\omega + b) - 1 + \xi_i] - \sum_{i=1}^{m}r_i\xi_i$$

Here, the αi's and ri's are our Lagrange multipliers (constrained to be ≥0). After setting the derivatives with respect to ω and b to zero as before, substituting them back in and simplifying, the following dual form of the problem will be obtained (see equation 8 below)

$$\max_\alpha W(\alpha) = \sum_{i=1}^{m}\alpha_i - \frac{1}{2}\sum y_i y_j \alpha_i \alpha_j \langle x_i, x_j\rangle \quad (8)$$

-continued $$\text{s.t. } 0 \leq \alpha_i \leq C, i = 1, \ldots, m$$

$$\sum_{i=1}^{m}\alpha_i y_i = 0$$

As noted above, the classification model is developed off-line (e.g., in a lab or a factory) and is then implemented on-line for real-time detection. Therefore, from an implementation standpoint, this boundary is included in the controller unit 200 (FIG. 2(*a*)). In some examples, the classification model, including this boundary, is included before shipping the arc detector 130 out to a customer. The offline training process, in some examples include data (or signal) acquisition, feature extraction (including data preprocessing using a transform technique and/or data rescaling), and applying a training algorithm according to a machine learning/pattern recognition technique. In some examples, SVM is adopted as the machine learning technique to develop the classification model. As noted above, SVM technique produces a hyperplane with a finite margin between the two competing classes. This hyperplane bounds the generalization error of the classification model. The separating hyperplane that creates the maximum distance between the plane and a nearest data sample is called the optimal separating hyperplane. In some examples, after training and developing the classification model, the equation of the hyperplane can be as simple as $a_1 x_1 + a_2 x_2 - c = 0$ for data sets represented as two element vectors $(x_1, x_2)$. Therefore, the boundary condition for on-line real-time detection may be: if $a_1 x_1 + a_2 x_2 - c > 0$, the acquired data is classified as class 1 (in some examples, this scenario may refer to the detection of an arc event). On the other hand, if $a_1 x_1 + a_2 x_2 - c < 0$, the acquired data may be determined as class 0 (in some examples, this scenario may refer to no-arc event).

Figure 3:
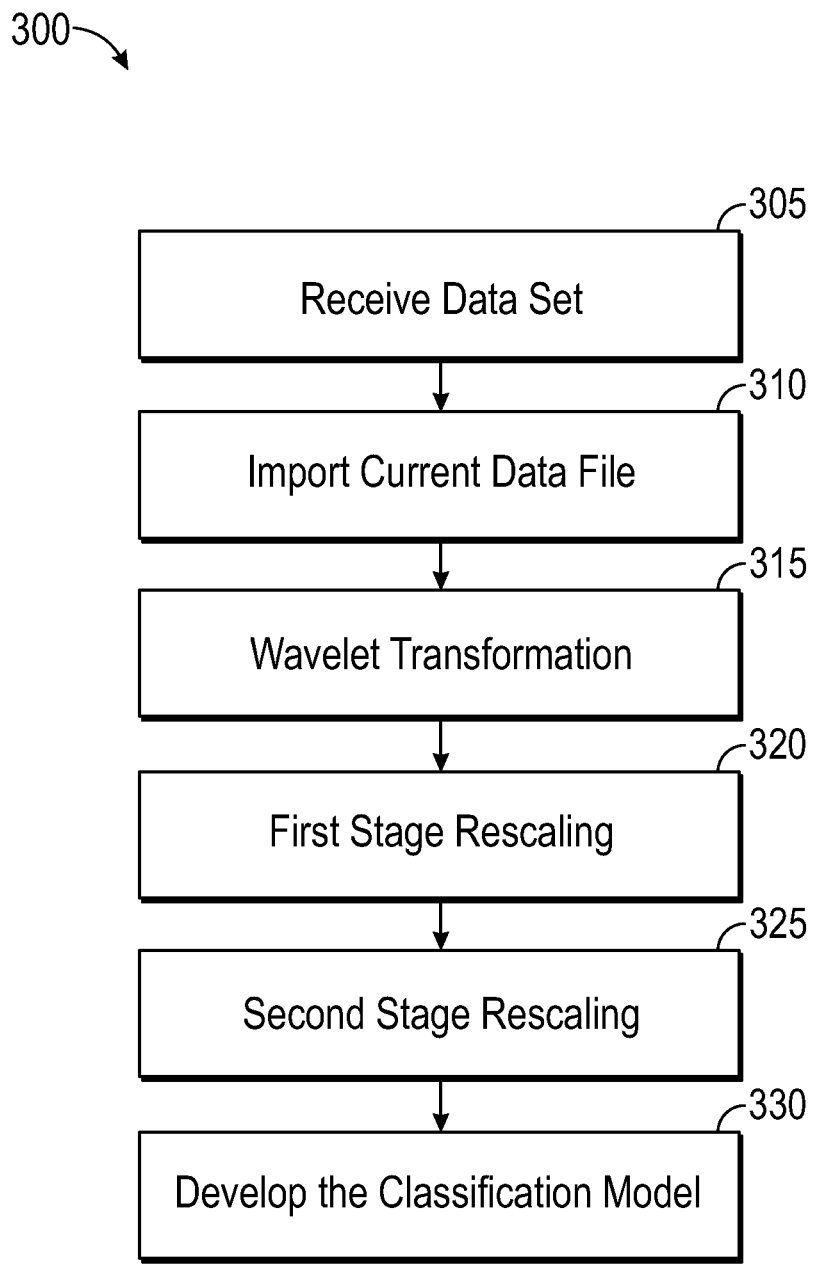
FIG. 3 shows an illustrative method utilized to develop a classification model to be used in the arc detection method, in accordance with various examples.

Referring now to FIG. 3, an illustrative method 300 that may be utilized to develop the classification model, which will be directly applied to the features extracted in the method 250. The method 300 begins with receiving data set (step 305) collected from a test PV system, which is set-up to gather signals relating to arcing and non-arcing events. The method 300 then moves to step 310 that includes importing the current data file from the received data set. For simplicity's sake, the example of current data file is assumed to be imported. The raw current data imported from the current data file is then transformed using a mathematical transformation technique, such as wavelet transformation. As noted above, various other transformation techniques may be employed to decompose the raw data set imported in step 310. The decomposed data set may be scaled (first stage scaling) using a known quantity of the test PV system, e.g., DC bias or temperature (step 320). The first stage scaled data, in some examples, may further be scaled with respect to another known quantity of the test PV system, or in some examples, is rescaled relative to a reference value. As noted above, the classification model is now developed using SVM technique. The SVM technique involves forming the hyperplane, which is formed by using an input data set. In some examples, the data set that has gone through both first and second set of rescaling is used as the data set that develops the classification model (step 330). In other examples, the data set that has gone through just one rescaling is used as the data set that develops the classification model (step 330). In some examples, the data set that is generated after the transformation (after step 315) is used as the data set that develops the classification model (step 330).

In the foregoing discussion and in the claims, the terms "including" and "comprising" are used in an open-ended fashion, and thus should be interpreted to mean "including, but not limited to . . . ." Also, the term "couple" or "couples" is intended to mean either an indirect or direct connection. Thus, if a first device couples to a second device, that connection may be through a direct connection or through an indirect connection via other devices and connections. Similarly, a device that is coupled between a first component or location and a second component or location may be through a direct connection or through an indirect connection via other devices and connections. An element or feature that is "configured to" perform a task or function may be configured (e.g., programmed or structurally designed) at a time of manufacturing by a manufacturer to perform the function and/or may be configurable (or re-configurable) by a user after manufacturing to perform the function and/or other additional or alternative functions. The configuring may be through firmware and/or software programming of the device, through a construction and/or layout of hardware components and interconnections of the device, or a combination thereof. Additionally, uses of the phrases "ground" or similar in the foregoing discussion are intended to include a chassis ground, an Earth ground, a floating ground, a virtual ground, a digital ground, a common ground, and/or any other form of ground connection applicable to, or suitable for, the teachings of the present disclosure. Unless otherwise stated, "about," "approximately," or "substantially" preceding a value means+/−10 percent of the stated value.

The above discussion is meant to be illustrative of the principles and various embodiments of the present disclosure. Numerous variations and modifications will become apparent to those skilled in the art once the above disclosure is fully appreciated. It is intended that the following claims be interpreted to embrace all such variations and modifications.

What is claimed is:

1. A system for detecting arc events, the system comprising:
    an arc fault detector configured to receive signals from a photovoltaic (PV) module via one or more wires; and
    wherein the arc fault detector comprises a controller coupled to the one or more wires and trained with a classification model to distinguish between signals indicating arc events from the PV module and signals not indicating arc events from the PV module, the controller further configured to:
        receive the signals;
        extract a plurality of features from the received signals, wherein the plurality of extracted features include a current and a voltage;
        classify the extracted features using the classification model;
        determine an occurrence of the arc event based on the classification; and
        provide an output signal indicating an arc event;
    wherein the classification system is based on a separating hyperplane is according to the following equation:

$$\omega^T x + b = 0,$$

wherein $\omega$ is an n-dimensional vector and b is the intercept term, and wherein $\omega$ and b determine the position of the separating hyperplane, and wherein a functional margin of the hyperplane is according to the following equation;

$$y_i(\omega^T x_i + b) \geq 1,$$

wherein $y_i$ are labels for the classification system, and wherein $x_i$ are n-dimensional inputs, wherein an optimum hyperplane can be found according to the following equation;

$$\min_{\omega,b} \frac{1}{2}\|\omega\|^2 + C\sum_{i=1}^{m} \xi_i,$$

wherein C is an error penalty, and wherein $\xi_i$ is a slack variable, and wherein a Lagrangian is according to the following equation;

$$\frac{1}{2}\omega^T \omega + C\sum_{i=1}^{m} \xi_i - \sum_{i=1}^{m} \alpha_i [y_i(x^T \omega + b) - 1 + \xi_i] - \sum_{i=1}^{m} r_i \xi_i,$$

wherein $\alpha_i$ and $r_i$ are Lagrange multipliers, and wherein a final weight equation to solve for the separating hyperplane is according to the following equation;

$$\sum_{i=1}^{m} \alpha_i - \frac{1}{2}\sum y_i y_j \alpha_i \alpha_j \langle x_i, x_j \rangle.$$

2. The system of claim 1, wherein the output signal is configured to shut-off the system based on the determination of the occurrence of the arc event.

3. The system of claim 1, wherein the arc event includes an arc fault.

4. The system of claim 1, wherein the arc event includes arc flash.

5. The system of claim 1, wherein the controller is configured to extract the features at least in part by wavelet decomposition.

6. The system of claim 1, wherein the classification model is a support vector machine (SVM) classification model.

7. The system of claim 1, wherein the controller is further configured to rescale the received signals at least once before classifying the extracted features using the classification model.

8. The system of claim 1, wherein the controller is configured to provide a time-stamp on the detected arc event.

9. A method for detecting arc events, the method comprising:
    receiving signals from a photovoltaic (PV) module with an arc fault detector via one or more wires, wherein the one or more wires couple the PV module to a controller of the arc fault detector, wherein the controller is trained with a classification model to distinguish between signals indicating arc events from the PV module and signals not indicating arc events from the PV module;
    acquiring, by the controller, data relating to the received signals;
    extracting, by the controller, a plurality of features from the received signals, wherein the plurality of extracted features include a current and a voltage;

classifying, by the controller, the plurality of features using the classification model; and determining, by the controller, an occurrence of an arc event based on the classification;

wherein the classification system is based on a separating hyperplane is according to the following equation:

$$\omega^T x + b = 0,$$

wherein $\omega$ is an n-dimensional vector and b is the intercept term, and wherein $\omega$ and b determine the position of the separating hyperplane, and wherein a functional margin of the hyperplane is according to the following equation;

$$y_i(\omega^T x_i + b) \geq 1,$$

wherein $y_i$ are labels for the classification system, and wherein $x_i$ are n-dimensional inputs, wherein an optimum hyperplane can be found according to the following equation;

$$\min_{\omega,b} \frac{1}{2}\|\omega\|^2 + C \sum_{i=1}^{m} \xi_i,$$

wherein C is an error penalty, and wherein $\xi_i$ is a slack variable, and wherein a Lagrangian is according to the following equation;

$$\frac{1}{2}\omega^T \omega + C \sum_{i=1}^{m} \xi_i - \sum_{i=1}^{m} \alpha_i [y_i(x^T \omega + b) - 1 + \xi_i] - \sum_{i=1}^{m} r_i \xi_i,$$

wherein $\alpha_i$ and $r_i$ are Lagrange multipliers, and wherein a final weight equation to solve for the separating hyperplane is according to the following equation;

$$\sum_{i=1}^{m} \alpha_i - \frac{1}{2} \sum y_i y_j \alpha_i \alpha_j \langle x_i, x_j \rangle.$$

10. The method of claim 9, wherein the extracting the plurality of features includes transforming the received signals.

11. The method of claim 10, further comprising rescaling, by the controller, the received signals at least once to extract the plurality of features.

12. The method of claim 9, wherein the classification model is a support vector machine (SVM) model.

13. The method of claim 9, further comprising shutting off, by the controller, an electrical system based on the determination of the occurrence of the arc event.

14. A photovoltaic system, comprising:
an arc fault detector configured to receive signals from a photovoltaic (PV) module via one or more wires, wherein the arc fault detector comprises a controller coupled to one or more wires, wherein the controller is trained with a classification model to distinguish between signals indicating arc events from the PV module and signals not indicating arc events in the PV module, the controller further configured to:
receive the signals;
extract a plurality of features from the received signals, wherein the plurality of extracted signals include a current and a voltage;
classify the extracted features using the classification model;
determine an occurrence of the arc event based on the classification; and
provide an output signal indicating an arc event;
wherein the classification system is based on a separating hyperplane is according to the following equation:

$$\omega^T x + b = 0,$$

wherein $\omega$ is an n-dimensional vector and b is the intercept term, and wherein $\omega$ and b determine the position of the separating hyperplane, and wherein a functional margin of the hyperplane is according to the following equation;

$$y_i(\omega^T x_i + b) \geq 1,$$

wherein $y_i$ are labels for the classification system, and wherein $x_i$ are n-dimensional inputs, wherein an optimum hyperplane can be found according to the following equation;

$$\min_{\omega,b} \frac{1}{2}\|\omega\|^2 + C \sum_{i=1}^{m} \xi_i,$$

wherein C is an error penalty, and wherein $\xi_i$ is a slack variable, and wherein a Lagrangian is according to the following equation;

$$\frac{1}{2}\omega^T \omega + C \sum_{i=1}^{m} \xi_i - \sum_{i=1}^{m} \alpha_i [y_i(x^T \omega + b) - 1 + \xi_i] - \sum_{i=1}^{m} r_i \xi_i,$$

wherein $\alpha_i$ and $r_i$ are Lagrange multipliers, and wherein a final weight equation to solve for the separating hyperplane is according to the following equation;

$$\sum_{i=1}^{m} \alpha_i - \frac{1}{2} \sum y_i y_j \alpha_i \alpha_j \langle x_i, x_j \rangle.$$

15. The photovoltaic system of claim 14, wherein the extracting the plurality of features includes transforming the received signals using wavelet decomposition.

16. The photovoltaic system of claim 14, further comprises the controller rescaling the received signals at least once before classifying the plurality of features.

17. The photovoltaic system of claim 14, wherein the classification model is a support vector machine (SVM) model.

18. The photovoltaic system of claim 14, wherein the output signal is configured to shut-off the photovoltaic system based on the determination of the occurrence of the arc event.

19. The system of claim 14, wherein the arc event includes an arc fault.

20. The system of claim 14, wherein the arc event includes arc flash.

* * * * *